(12) United States Patent
Lee et al.

(10) Patent No.: US 9,793,333 B2
(45) Date of Patent: *Oct. 17, 2017

(54) ORGANIC LIGHT-EMITTING DEVICE AND METHOD OF MANUFACTURING SAME

(71) Applicant: LG Display Co., Ltd., Seoul (KR)

(72) Inventors: Yeon Keun Lee, Daejeon (KR); Sang Jun Park, Daejeon (KR); Yongnam Kim, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/940,268

(22) Filed: Nov. 13, 2015

(65) Prior Publication Data

US 2016/0072092 A1 Mar. 10, 2016

Related U.S. Application Data

(63) Continuation of application No. PCT/KR2014/004386, filed on May 16, 2014.

(30) Foreign Application Priority Data

May 16, 2013 (KR) ........................ 10-2013-0055997

(51) Int. Cl.
*H01L 27/32* (2006.01)
*H01L 51/52* (2006.01)
*H01L 51/56* (2006.01)

(52) U.S. Cl.
CPC .......... *H01L 27/3276* (2013.01); *H01L 27/32* (2013.01); *H01L 27/3288* (2013.01);
(Continued)

(58) Field of Classification Search
CPC . H01L 27/32; H01L 27/3202; H01L 27/3204; H01L 27/3241; H01L 27/3258;
(Continued)

(56) References Cited

U.S. PATENT DOCUMENTS 6,713,955 B1 3/2004 Roitman et al.
9,506,633 B2 * 11/2016 Tischler ................ F21V 19/005
(Continued)

FOREIGN PATENT DOCUMENTS

CN 101964354 B 5/2012
CN 102474936 A 5/2012
(Continued)

OTHER PUBLICATIONS

Search Report of European Patent Office in Appl'n. No. 14797396.0, dated Jan. 5, 2017.

*Primary Examiner* — Eduardo A Rodela
(74) *Attorney, Agent, or Firm* — Dentons US LLP

(57) ABSTRACT

Disclosed is an organic light emitting device (OLED) that may include a first electrode including at least two conductive units, each of the at least conductive unit connected to a conductive connector of the first electrode; a second electrode facing the first electrode; an organic layer between the first electrode and the second electrode; an auxiliary electrode electrically connected to the conductive connector; and an insulating layer between the conductive connector and the auxiliary electrode, wherein the conductive connector overlaps the auxiliary electrode, with the insulating layer therebetween.

29 Claims, 9 Drawing Sheets

(52) U.S. Cl.
CPC ...... *H01L 27/3297* (2013.01); *H01L 51/5203* (2013.01); *H01L 51/5209* (2013.01); *H01L 51/5212* (2013.01); *H01L 51/56* (2013.01); *H01L 51/5268* (2013.01); *H01L 2251/5361* (2013.01); *H01L 2251/5392* (2013.01); *H01L 2251/568* (2013.01)

(58) Field of Classification Search
CPC ............. H01L 27/3276; H01L 27/3281; H01L 27/3288; H01L 27/3297
See application file for complete search history.

(56) References Cited

U.S. PATENT DOCUMENTS

| | | | |
|---|---|---|---|
| 2004/0079941 A1* | 4/2004 | Yamazaki | H01L 27/1266 257/40 |
| 2005/0116628 A1 | 6/2005 | Lee | |
| 2005/0225234 A1 | 10/2005 | Tyan et al. | |
| 2010/0283071 A1 | 11/2010 | Li et al. | |
| 2011/0068688 A1 | 3/2011 | Choi et al. | |
| 2011/0193066 A1 | 8/2011 | Parker et al. | |
| 2011/0220957 A1 | 9/2011 | Hartmann et al. | |
| 2012/0146485 A1 | 6/2012 | Matsubayashi et al. | |
| 2012/0228591 A1 | 9/2012 | Sawabe et al. | |
| 2013/0140550 A1 | 6/2013 | Lee et al. | |
| 2016/0005993 A1* | 1/2016 | Lee | H01L 51/5212 257/40 |
| 2016/0020429 A1* | 1/2016 | Kuroki | H01L 51/5268 257/40 |
| 2016/0027862 A1* | 1/2016 | Lee | H01L 51/56 257/40 |

FOREIGN PATENT DOCUMENTS

| | | |
|---|---|---|
| EP | 1003229 A1 | 5/2000 |
| EP | 2497810 A1 | 9/2012 |
| JP | 5-307997 A | 11/1993 |
| JP | 2001196190 A | 7/2001 |
| JP | 2001-338770 A | 12/2001 |
| JP | 2005-166671 A | 6/2005 |
| KR | 10-2006-0130729 A | 12/2006 |
| KR | 10-2011-0032672 A | 3/2011 |
| KR | 10-2011-0102373 A | 9/2011 |
| TW | I286447 B | 9/2007 |
| WO | 2012/021024 A2 | 2/2012 |
| WO | 2013/030919 A1 | 3/2013 |

* cited by examiner

[Figure 1]

[Figure 7]
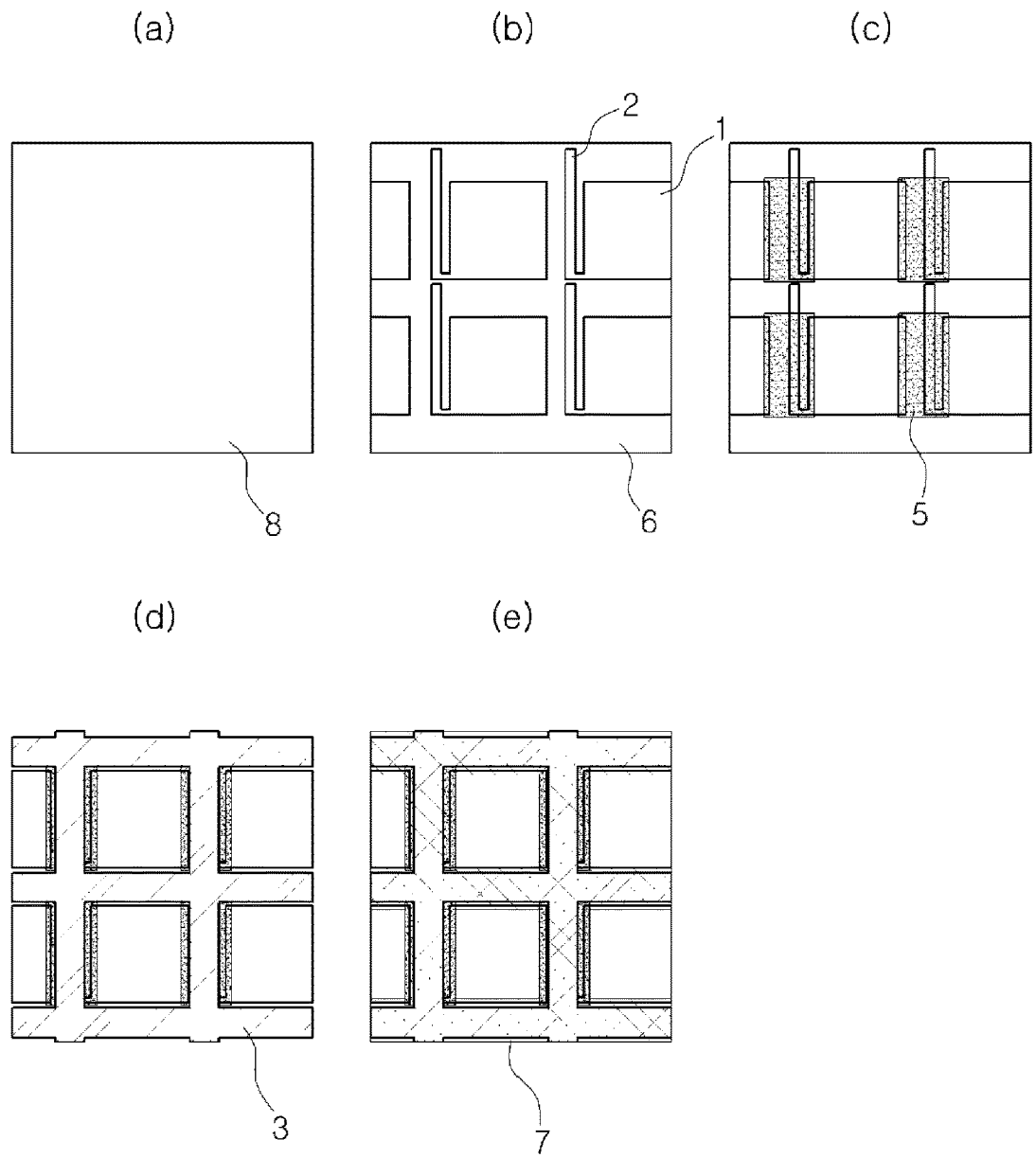

[Figure 8]
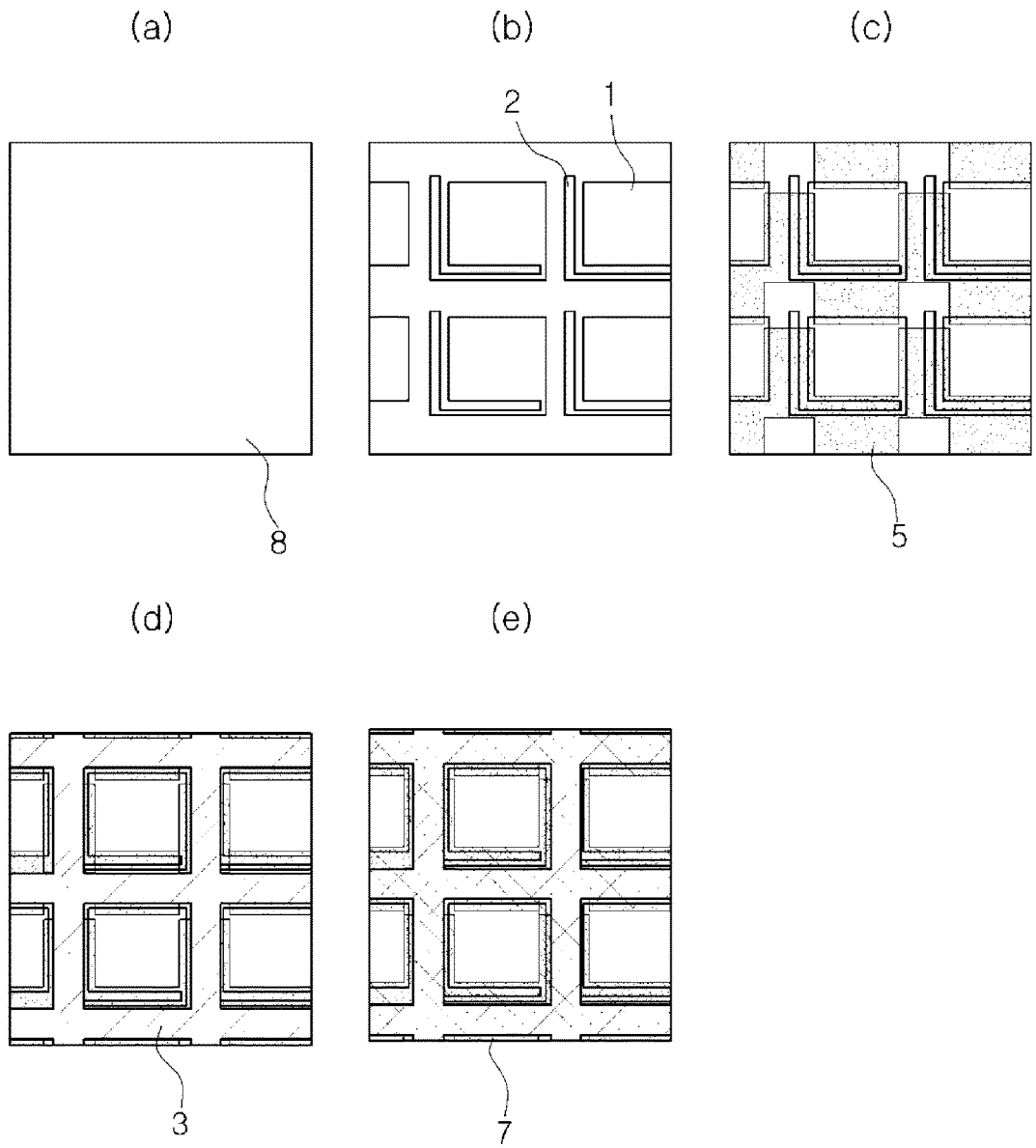

[Figure 9]
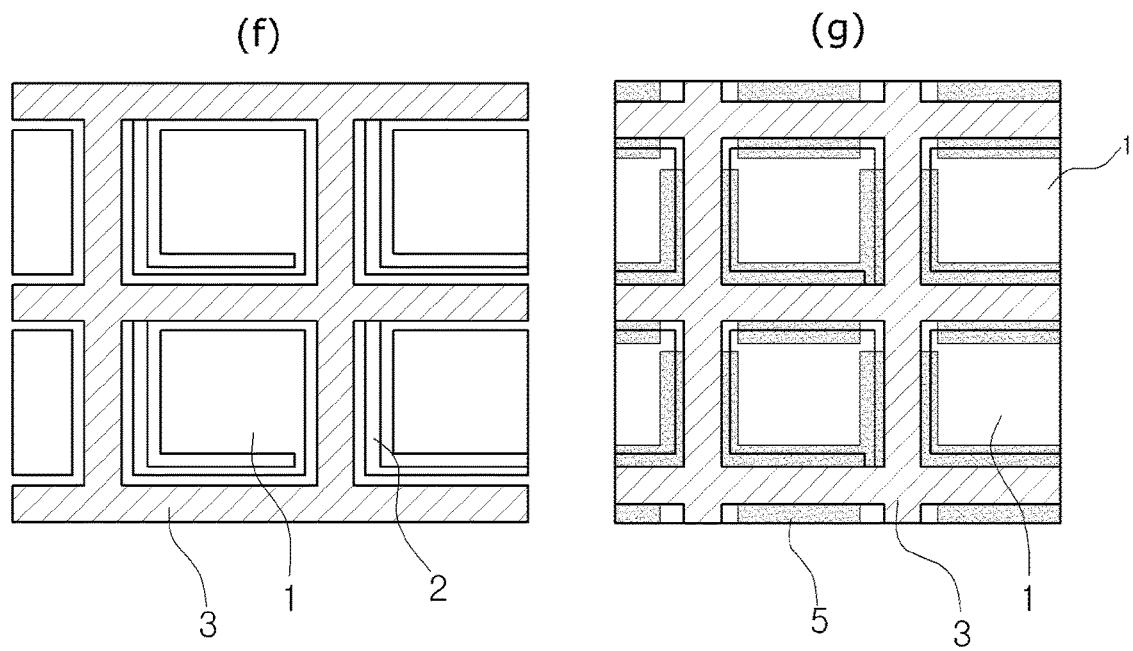

[Figure 10]
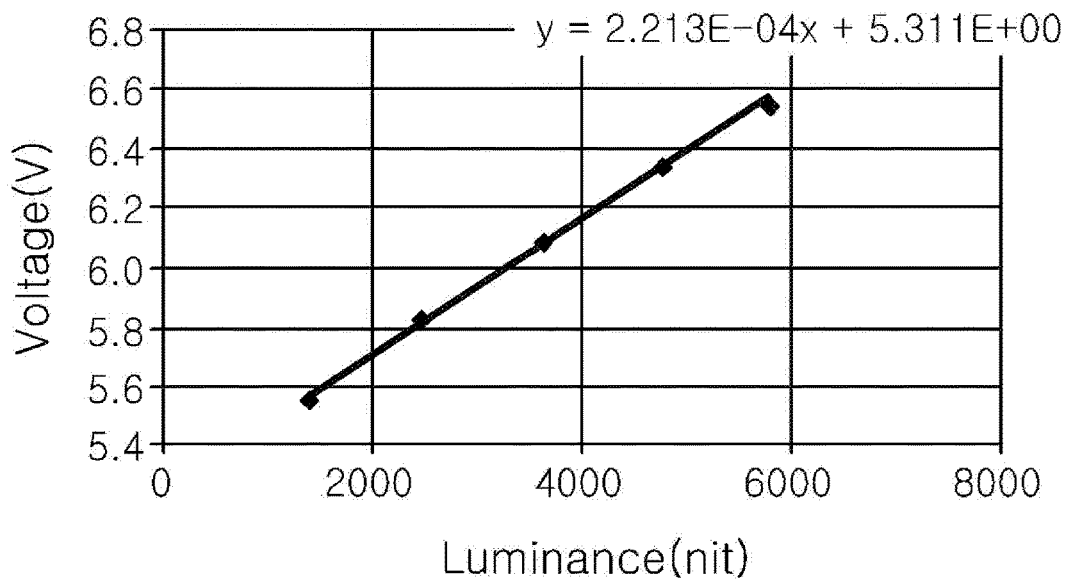

ORGANIC LIGHT-EMITTING DEVICE AND METHOD OF MANUFACTURING SAME

This application is a Continuation Bypass of International Application No. PCT/KR2014/004386, filed May 16, 2014, and claims the benefit of Korean Application No. 10-2013-0055997, filed on May 16, 2013, both of which are hereby incorporated by reference in their entirety for all purposes as if fully set forth herein.

TECHNICAL FIELD

The present specification relates to an organic light emitting device (OLED) and a method for manufacturing the OLED.

BACKGROUND ART

An organic light emitting phenomenon refers to a phenomenon of converting electrical energy to light energy using an organic material. That is, when positioning an appropriate organic layer between an anode and a cathode, and then applying a voltage between two electrodes, holes are injected into the organic layer from the anode and electrons are injected into the organic layer from the cathode. Excitons are generated when the injected holes and electrons encounter each other, and light is generated when the excitons fall down to a lower energy state.

Since an interval between the anode and the cathode is small, an organic light emitting device (OLED) is easy to have a short-circuit defect. Due to a pinhole, a crack, a step and coating roughness in a structure of the OLED, and the like, the anode and the cathode may directly contact with each other. The thickness of the organic layer may become thinner in such a defect zone. The defect zone may provide a low resistance path in which current easily flows, thereby reducing or preventing sufficient current from flowing through the OLED in an extreme case. Accordingly, light emitting output of the OLED may decrease or disappear.

In a multi-pixel OLED, such a short-circuit defect may generate a dead pixel of not emitting light or emitting light less than the average light intensity, thereby degrading the display quality. In the case of a lighting or other low resolution usages, a large portion of the OLED device may not operate due to the short-circuit defect.

Due to concerns about the short-circuit defect, manufacturing of an OLED is generally performed in a clean room. However, even a clean environment may not effectively remove the short-circuit defect. In many cases, to decrease the number of short-circuit defects by increasing the interval between two electrodes, the thickness of the organic layer may be unnecessarily increased as compared to a thickness desired to operate the OLED. Such a method may add cost in manufacturing the OLED. Further, the method may not completely remove the short-circuit defect.

RELATED ART LITERATURE

Patent Document

Korean Patent Application Laid-Open No. 2006-0130729

DETAILED DESCRIPTION OF THE INVENTION

Technical Problem

The present invention is to provide an organic light emitting device (OLED) that may operate within a normal range even in a case in which a factor capable of causing a short-circuit defect is present while maintaining an aperture ratio of the OLED, that is, even in a case in which the short-circuit defect occurs, and a method for manufacturing the OLED.

Technical Solution

An exemplary embodiment of the present specification provides an organic light emitting device (OLED), including: a first electrode including at least two conductive units and a conductive connector connected to the conductive units, respectively; a second electrode provided to face the first electrode; at least one organic layer provided between the first electrode and the second electrode; an auxiliary electrode electrically connected with each conductive connector; and an insulating layer provided between the conductive connector and the auxiliary electrode, and configured to insulate at least a part of the conductive connector from the auxiliary electrode, in which the conductive connector includes a short-circuit preventing area in which a length of a direction in which current flows is longer than a width of a direction vertical to the length of the direction.

Another exemplary embodiment of the present specification provides a method for manufacturing the OLED, including: preparing a substrate; forming a first electrode including two or more conductive units, and conductive connectors connected to the conductive units, respectively, on the substrate; forming an auxiliary electrode on the substrate; forming an insulating layer between at least a part of the conductive connector and the auxiliary electrode; forming at least one organic layer on the first electrode; and forming a second electrode on the organic layer.

Still another exemplary embodiment of the present specification provides a display device including the OLED.

Yet another exemplary embodiment of the present specification provides a lighting device comprising the OLED.

It is to be understood that both the foregoing general description and the following detailed description are exemplary and explanatory and are intended to provide further explanation of the invention as claimed.

Advantageous Effects

An OLED according to the present specification may normally maintain a function of the OLED even though a short-circuit occurs due to a defect of a substrate itself.

An OLED according to the present specification may stably operate without increasing a leakage current amount even though an area size of a short-circuit occurrence point increases.

Further, an OLED according to the present specification may dispose an auxiliary electrode while maintaining an aperture ratio.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

BRIEF DESCRIPTION OF DRAWINGS

The accompanying drawings, which are included to provide a further understanding of the invention and are incorporated in and constitute a part of this specification, illustrate embodiments of the invention and together with the description serve to explain the principles of the invention.

FIGS. 7 and 8 illustrate an operation of manufacturing an OLED according to the present specification.

FIG. 9 illustrates comparison between a case where the insulating layer of the present specification is not provided, and a case where the insulating layer of the present specification is provided.

FIG. 10 illustrates a driving characteristic of the OLED according to the present specification.

ILLUSTRATED EMBODIMENTS

Figure 1:
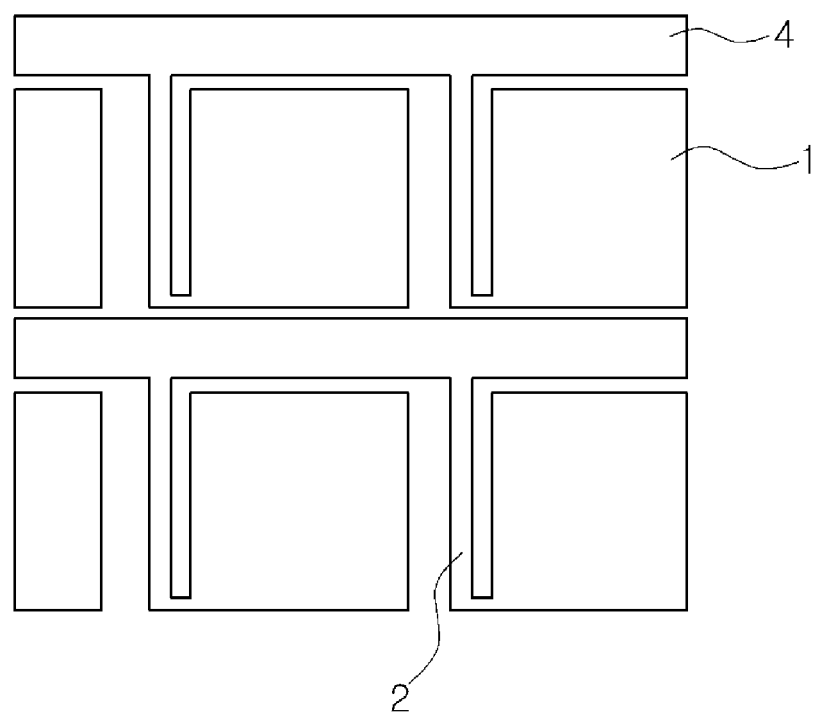
FIGS. 1 to 3 illustrate an example of a first electrode according to the present specification.

Reference will now be made in detail to embodiments of the present invention, examples of which are illustrated in the accompanying drawings. The same reference numbers may be used throughout the drawings to refer to the same or like parts.

In the following description, when a predetermined member is positioned "on" another member, it may include not only a case in which the predetermined member contacts with the other member but also a case in which other additional member(s) is present between the two members.

An exemplary embodiment of the present specification provides an organic light emitting device (OLED), including: a first electrode including at least two conductive units and a conductive connector connected to the conductive units, respectively; a second electrode provided to face the first electrode; at least one organic layer provided between the first electrode and the second electrode; an auxiliary electrode electrically connected with each conductive connector; and an insulating layer provided between the conductive connector and the auxiliary electrode and configured to insulate at least a part of the conductive connector from the auxiliary electrode, in which the conductive connector includes a short-circuit preventing area in which a length of a direction in which current flows is longer than a width of a direction vertical to the length of the direction.

A current may be provided to each of the conductive units through the area having a short-circuit preventing function. Particularly, according to an exemplary embodiment of the present invention, the area having a short-circuit preventing function may be a conductive connector and/or a short-circuit preventing layer which will be described below.

The conductive units may be electrically separated from each other, and a current may be supplied to each of the conductive units through an area having a short-circuit preventing function from the auxiliary electrode. This may reduce or prevent an entire OLED from malfunctioning due to a current flowing into the conductive unit in which a short-circuit defect is generated, which otherwise would flow into another conductive units without the short-circuit defect.

According to an exemplary embodiment of the present specification, the conductive units may be electrically connected in parallel to each other.

According to an exemplary embodiment of the present specification, each of the conductive units may be electrically connected with one distal end of any one of the conductive connector, and the auxiliary electrode may be electrically connected with another distal end of any one of the conductive connector.

According to an exemplary embodiment of the present specification, the first electrode may further include a current carrying portion of the first electrode electrically connecting the two or more conductive connectors, and the auxiliary electrode may be electrically connected with the conductive connector through the current carrying portion of the first electrode. Particularly, the auxiliary electrode may be provided on the current carrying portion of the first electrode.

The current carrying portion of the first electrode may function to physically connect each conductive connector and to flow current into each conductive unit through each conductive connector.

According to an exemplary embodiment of the present specifically, the current carrying portion of the first electrode or the auxiliary electrode may be provided to be separate from the conductive unit.

According to an exemplary embodiment of the present specification, the OLED may include all of the current carrying portion of the first electrode and the auxiliary electrode. Specifically, according to an exemplary embodiment of the present specification, the auxiliary electrode may be electrically connected to the conductive connector through the current carrying portion of the first electrode. Specifically, the auxiliary electrode may be provided on the current carrying portion of the first electrode.

"On the current carrying portion" may also indicate one side surface of the current carrying portion in addition to only a top surface of the current carrying portion. Also, "on the current carrying portion" may also indicate one area of a top surface, a bottom surface, and a side surface of the current carrying portion. Also, "on the current carrying portion" may also include one area of the top surface and one area of the side surface of the current carrying portion, and may include one area of the bottom surface and one area of the side surface of the current carrying portion.

The current carrying portion of the first electrode may function to physically connect each conductive connector and to flow current in each conductive unit through each conductive connector.

The conductive units may be physically connected through the current carrying portion and the conductive connectors of the first electrode through a patterning process of the first electrode, and may be electrically connected in parallel. An example thereof is illustrated in FIG. 1.

Referring to FIG. 1, a patterned first electrode includes conductive units 1, conductive connectors 2, and current carrying portions 4 of the first electrode.

Each of the conductive units may receive a current through the conductive connector from the auxiliary electrode. Otherwise, the conductive unit may receive a current through the auxiliary electrode and the current carrying portion of the first electrode.

The conductive connectors may be patterned to be connected with the conductive units, respectively, through a patterning process of the first electrode. An example thereof is illustrated in FIGS. 2 and 3.

Figure 2:
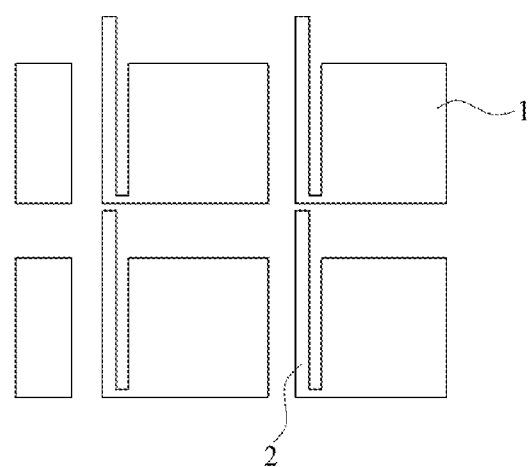
Figure 3:
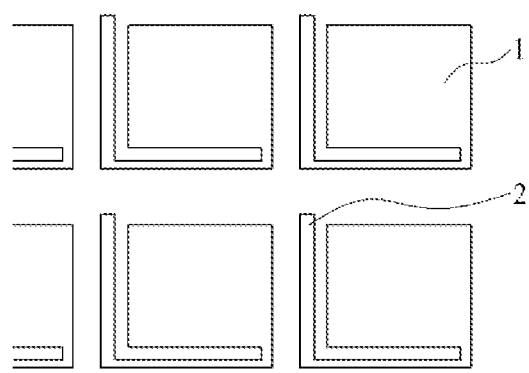

Referring to FIGS. 2 and 3, the first electrode includes the conductive units 1 and the conductive connectors 2.

The conductive unit may be included in a light emitting area of the OLED. Specifically, according to an exemplary embodiment of the present specification, at least a portion of each conductive unit may be positioned on the light emitting area of the OLED. That is, according to an exemplary embodiment of the present specification, a light emitting phenomenon may occur on an organic layer including a light emitting layer formed on an area that substantially corresponds to the conductive unit, and light may be emitted through the conductive unit.

The current of the OLED may flow in the direction of the auxiliary electrode, the conductive connector, the conductive unit, the organic layer, and the second electrode, and may flow in a reverse direction thereof. Alternatively, the current of the OLED may flow in the direction of the auxiliary electrode, the current carrying portion of the first electrode, the conductive connector, the conductive unit, the organic layer, and the second electrode, and may flow in a reverse direction thereof.

According to an exemplary embodiment of the present specification, each conductive unit may be supplied with current from the auxiliary electrode through the conductive connector.

The light emitting area indicates an area in which light emitted from the light emitting layer of the organic layer 9 is emitted through the first electrode 8 and/or the second electrode 10. For example, in the OLED according to an exemplary embodiment of the present specification, the light emitting area may be formed on at least a portion of an area of the first electrode 8 in which the conductive connector 2, the auxiliary electrode 3, and/or the short-circuit preventing layer are not formed in an area in which the first electrode 8 is formed on the substrate 6. Also, a non-emitting area indicates a remaining area excluding the light emitting area.

According to an exemplary embodiment of the present specification, the current carrying portion of the first electrode, the auxiliary electrode, and the conductive connector may be positioned on the non-emitting area of the OLED.

According to an exemplary embodiment of the present specification, the conductive units may be separate from each other. Each conductive unit may be supplied with current from the current carrying portion of the first electrode connected to the conductive connector or the auxiliary electrode. This may reduce or prevent the overall non-operation of the OLED from occurring when current that is to flow in another conductive unit in which the short-circuit is absent flows in a conductive unit in which the short-circuit is present, in a case in which the short-circuit occurs in any one conductive unit.

The conductive connector may be an end portion of the conductive unit in the first electrode and a shape or a position thereof is not particularly limited. For example, in a case in which the conductive unit is formed in a flattened "U" or "L" shape, the conductive connector may be an end portion of the conductive unit. Alternatively, the conductive connector may have a shape that is protruded from one vertex, one corner, or a middle portion of one side of the conductive unit in a polygonal shape such as a rectangular shape.

According to an exemplary embodiment of the present specification, the conductive connector may include a short-circuit preventing area in which a length of a direction in which current flows is longer than a width of a direction vertical to the length of the direction. Specifically, according to an exemplary embodiment of the present specification, the short-circuit preventing area of the conductive connector may include an area in which a ratio of the length to the width is 10:1 or more.

The conductive connector may have relatively high resistance compared to the conductive unit. Further, the conductive connector of the present specification may perform a short-circuit preventing function in the OLED. That is, even when a short-circuit defect occurs due to a short-circuit occurring in the OLED, the conductive connector may function to enable an operation of the OLED.

According to an exemplary embodiment of the present specification, a material of the conductive connector may be the same as a material of the conductive unit. Specifically, the conductive connector and the conductive unit are included in the first electrode and thus, may be formed using the same material.

The short-circuit defect may occur in a case in which the second electrode directly contacts with the first electrode. Alternatively, the short-circuit defect may occur even in a case in which due to a decrease in a thickness or deformation of the organic layer disposed between the first electrode and the second electrode, a function of the organic layer is lost and thereby the first electrode and the second electrode contact with each other. When the short-circuit defect occurs, a low current path may be provided to the OLED, thereby enabling the OLED to anomalously operate. Due to a leakage current that directly flows from the first electrode to the second electrode by the short-circuit defect, current of the OLED may flow avoiding a zero-defect zone. It may decrease the light emitting output of the OLED. In a serious case, the OLED may not operate. Also, when current distributed and thereby flowing over a wide area of organic materials is concentrated and thereby flows at a short-circuit occurrence point, high heat may be locally generated so that the OLED may be broken or a fire may occur.

However, even when the short-circuit defect occurs in any one or more conductive units among the conductive units of the OLED according to an exemplary embodiment of the present specification, it may be possible to prevent all the driving current from flowing in a short-circuit defect portion using the conductive connector. That is, the conductive connector may perform a role of controlling an amount of leakage current not to unlimitedly increase. Accordingly, even when the short-circuit defect occurs in a portion of the conductive units of the OLED, remaining conductive units in which the short-circuit defect is absent may normally operate.

The conductive connector has a high resistance value. Therefore, in a case in which the short-circuit defect occurs, the conductive connector may provide an appropriate resistance, thereby reducing or preventing the current from leaking through the short-circuit defect portion. To this end, the conductive connector may have a resistance value suitable for decreasing the leakage current caused by the short-circuit defect and the light emitting efficiency loss associated therewith.

According to an exemplary embodiment of the present specification, the conductive connector may have a resistance value capable of reducing or preventing the short-circuit defect by including the short-circuit preventing area in which a ratio of the length to the width is 10:1 or more. Further, according to an exemplary embodiment of the present specification, the portion in which the ratio of the length to the width is 10:1 or more may be an entire area of the conductive connector. Alternatively, the area in which the ratio of the length to the width is 10:1 or more may be a partial area of the conductive connector.

Figure 6:
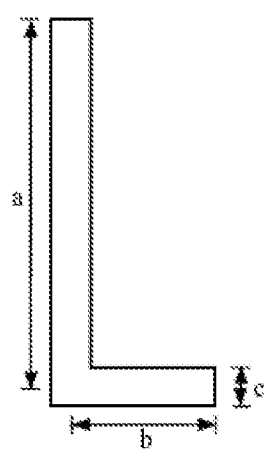
FIG. 6 illustrates an example of a length and a width of a short-circuit preventing area in a conductive connector of the present specification.

The length and the width are relative concepts and thus, the length indicates a spatial distance from one end of the conductive connector to the other end thereof from view of an upper portion. That is, even though the conductive connector is a combination of straight lines or includes a curve, the length indicates a value obtained by measuring the length based on the assumption that the length is a straight line. The width indicates a distance from a center of a lengthwise direction of the conductive connector to both ends of a vertical direction thereof from view of an upper portion. Also, when the width varies, it may be an average value of a width of any one conductive connector. FIG. 6 illustrates an example of a length and a width of the short-circuit preventing area in the conductive connector.

The length indicates a dimension of a direction in which the current substantially flows. Also, the width indicates a dimension of a direction vertical to the direction in which the current substantially flows.

The length indicates a travel distance of the current from the current carrying portion of the first electrode or the auxiliary electrode to the conductive unit. The width indicates a distance vertical to the lengthwise direction.

In FIG. 6, the length may be a summation of "a" and "b", and the width may be "c".

According to an exemplary embodiment of the present specification, the OLED includes an insulating layer provided between the conductive connector and the auxiliary electrode and configured to insulate at least a part of the conductive connector from the auxiliary electrode.

According to an exemplary embodiment of the present specification, the insulating layer may insulate at least a part of the short-circuit preventing area of the conductive connector from the auxiliary electrode. Particularly, the insulating layer may insulate the short-circuit preventing area of the conductive connector from the auxiliary electrode.

According to an exemplary embodiment of the present specification, the insulating layer may be provided on the short-circuit preventing area of the conductive connector, and at least a part of the auxiliary electrode may be provided on the insulating layer.

The "provided on the short-circuit preventing area" may mean "provided on one surface of the short-circuit preventing area." Particularly, the "provided on the short-circuit preventing area" may mean "provided on an upper surface or a lower surface of the short-circuit preventing area."

The "provided on the insulating layer" may mean "provided on one surface of the insulating layer." Particularly, the "provided on the insulating layer" may mean "provided on an upper surface of a lower surface or the insulating layer."

According to an exemplary embodiment of the present specification, the first electrode may be provided on a substrate, the insulating layer may be provided on the upper surface of the short-circuit preventing area of the first electrode, and the auxiliary electrode may be provided on the upper surface of the insulating layer.

According to an exemplary embodiment of the present specification, the auxiliary electrode may be provided on the substrate, the insulating layer may be provided on the upper surface of the auxiliary electrode, and the short-circuit preventing area of the first electrode may be provided on the insulating layer.

According to an exemplary embodiment of the present specification, the auxiliary electrode and the connective connector may be provided to overlap a non-emitting area of the OLED.

According to an exemplary embodiment of the present specification, when the OLED does not include the current carrying portion of the first electrode, the remaining area except for a partial area, in which the conductive connector is electrically in contact with the auxiliary electrode, may be insulated from the auxiliary electrode through the insulating layer.

According to an exemplary embodiment of the present specification, when the OLED includes the current carrying portion of the first electrode, an entire area of the conductive connector may be insulated from the auxiliary electrode through the insulating layer.

According to an exemplary embodiment of the present specification, the insulating layer may be provided between at least a part of the short-circuit preventing area of the conductive connector and the auxiliary electrode.

According to an exemplary embodiment of the present specification, the auxiliary electrode may be provided to overlap at least a part of the area including the short-circuit preventing area.

The "overlap" may mean "provided while overlapping the same area based on a plan view of the OLED."

According to an exemplary embodiment of the present specification, the insulating layer may be provided to surround the short-circuit preventing area.

The conductive connector and the auxiliary electrode of the present specification may correspond to the non-emitting area of the OLED. Accordingly, in order to increase an aperture ratio of the OLED, the conductive connector and the auxiliary electrode are beneficially provided while overlapping each other.

That is, when the auxiliary electrode is disposed to be spaced apart from the conductive connector that is the non-emitting area, there may occur a problem in that an area of the non-emitting area is increased in the entire OLED. Accordingly, when the conductive connector and the auxiliary electrode are provided to overlap each other, it may be possible to reduce or prevent a decrease in the aperture ratio of the OLED.

Further, when the decrease in the aperture ratio is reduced or prevented, it may be possible to solve a problem that an operation current density of the OLED is increased under the same luminous flux and thus a lifespan is decreased.

However, when the auxiliary electrode is in contact with the short-circuit preventing area, a resistance value of the short-circuit preventing area is decreased by a lower resistance value of the auxiliary electrode, so that the short-circuit preventing function may not be appropriately performed. Accordingly, the insulating layer may be desired in order to maintain an appropriate resistance value of the short-circuit preventing area. That is, in the case where the insulating layer is not included, when the auxiliary electrode is formed on the short-circuit preventing area of the conductive connector, the short-circuit preventing area may not appropriately perform its own function due to the low resistance value of the auxiliary electrode.

According to an exemplary embodiment of the present specification, the insulating layer may be provided between the short-circuit preventing area and the auxiliary electrode in the region in which the short-circuit preventing area overlaps the auxiliary electrode.

According to an exemplary embodiment of the present specification, the space between the short-circuit preventing area and the auxiliary electrode may be a space between the short-circuit preventing area and the auxiliary electrode in a vertical direction based on the first electrode or the substrate.

Otherwise, according to an exemplary embodiment of the present specification, the insulating layer may be provided to surround the region of the conductive connector, except for one distal end of any one of the conductive connector, that is, one distal end of any one of the conductive connector closer to the auxiliary electrode. Otherwise, the insulating layer may be provided to surround an entire short-circuit preventing area.

The "surround" may mean that when the conductive connector is provided on the substrate, the conductive connector is provided in a region except for a region which is in contact with the substrate, thereby being insulated from another material.

Figure 4:
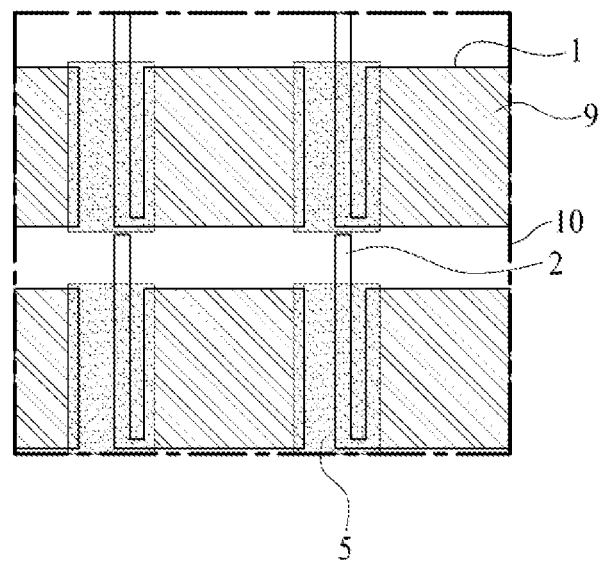
FIGS. 4 and 5 illustrate an example of a first electrode including an insulating layer according to the present specification.
Figure 5:
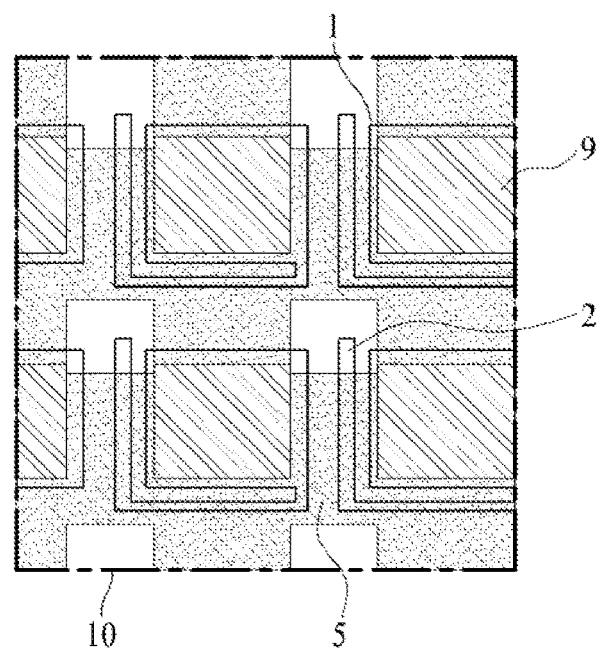

FIGS. 4 and 5 illustrate an example of a first electrode including an insulating layer according to an exemplary embodiment of the present specification.

Referring to FIGS. 4 and 5, the first electrode includes the conductive connectors 2 and the conductive units 1, and the insulating layer 5 is provided in a region except for one distance end of the conductive connector.

FIG. 9 illustrates comparison between a case in the left figure where an insulating layer is not provided and a case in the right figure where an insulating layer is provided.

Referring to FIG. 9, the emitting areas, which substantially corresponds to the conductive units 1, are substantially the same as each other. However, in the case where an insulating layer is not provided, because the conductive connector 2 and the auxiliary electrode 3 are spaced apart from each other, the non-emitting area is increased. On the contrary, in the case where an insulating layer is not provided, because the conductive connector 2 and the auxiliary electrode 3 can be disposed so as to overlap with each other, it may be possible to decrease the non-emitting area.

According to an exemplary embodiment of the present specification, at current density of any one value of 1 mA/cm² to 5 mA/cm², the conductive connector may have a resistance value at which an operating voltage increase rate of the following Formula 1 and a numerical value of operating current to leakage current of the following Formula 2 simultaneously satisfy 0.03 or less:

$$\frac{V_t - V_o}{V_o} \quad \text{[Formula 1]}$$

$$\frac{I_s}{I_t} \quad \text{[Formula 2]}$$

$V_t(V)$ denotes operating voltage of the OLED to which the conductive connector is applied and in which a short-circuit defect is absent.

$V_o(V)$ denotes operating voltage of the OLED to which the conductive connector is not applied and in which the short-circuit defect is absent.

$I_t(mA)$ denotes operating current of the OLED to which the conductive connector is applied and in which the short-circuit defect is absent.

$I_s(mA)$ denotes leakage current of the OLED to which the conductive connector is applied and in which the short-circuit defect is present in any one conductive unit.

$V_o(V)$ may denote operating voltage in a case in which the short-circuit defect is absent in an OLED of which a remaining configuration excluding only the conductive connector portion is the same.

Resistance or a resistance value of the conductive connector may denote resistance from one end portion of the conductive connector to the other end portion thereof. Specifically, the resistance or the resistance value of the conductive connector may be resistance from the conductive unit to the auxiliary electrode. Alternatively, the resistance or the resistance value of the conductive connector may be resistance from the conductive unit to the current carrying portion of the first electrode. Alternatively, the resistance or the resistance value of the conductive connector may be resistance from the conductive unit to the short-circuit preventing layer.

A process of inducing the resistance value of the conductive connector at which the operating voltage increase rate of the above Formula 1 and the numerical value of operating current to leakage current of the above Formula 2 simultaneously satisfy 0.03 or less is as follows.

In a state in which the short-circuit defect is absent, the operating current $I_t(mA)$ of the OLED may be expressed as the following formula.

$$I_t = n_{cell} \times I_{cell}$$

$n_{cell}$ denotes the number of conductive units corresponding to a light emitting area in the OLED.

$I_{cell}$ denotes current (mA) operating in one conductive unit in a case in which the OLED normally operates.

Each conductive unit is connected in parallel and thus, resistance $(R_{org})(\Omega)$ applied to the entire OLED may be expressed as follows.

$$R_{org} = \frac{R_{cell\text{-}org}}{n_{cell}}$$

$R_{cell\text{-}org}(\Omega)$ denotes organic resistance $(\Omega)$ in one conductive unit.

Compared to a case in which the conductive connector is absent, operating voltage increases in the OLED including the conductive connector. Accordingly, when the conductive connector is applied, the conductive connector is designed such that the efficiency of the OLED is not greatly degraded.

In a normal operation state of the OLED, the operating voltage increase rate occurring when the conductive connector is added may be expressed as the following Formula 1.

$$\frac{V_t - V_o}{V_o} \quad \text{[Formula 1]}$$

In the above Formula 1, $V_t(V)$ denotes operating voltage of the OLED to which the conductive connector is applied and in which the short-circuit defect is absent and $V_o(V)$ denotes operating voltage of the OLED to which the conductive connector is not applied and in which the short-circuit defect is absent.

The operating voltage increase rate $((V_t - V_o)/V_o)$ may be calculated according to the following formula.

$$\frac{V_t - V_o}{V_o} = \frac{R_{cell\text{-}spl}}{R_{cell\text{-}org}}$$

$R_{cell\text{-}spl}$ denotes resistance $(\Omega)$ of the conductive connector in one conductive unit.

$R_{cell\text{-}org}$ denotes organic resistance $(\Omega)$ in one conductive unit.

The operating voltage increase rate $((V_t - V_o)/V_o)$ may be induced through the following formula.

$$V_o = \frac{I_t \times (R_{org})}{1000}$$

-continued $$V_t = I_{cell} \times \frac{(R_{cell\text{-}org} + R_{cell\text{-}spl})}{1000}$$

In the case of the OLED in which the conductive connector is absent, when defining, as $I_n$, current (mA) flowing through a normal organic layer in the case of the short-circuit occurrence, defining, as $I_s$, leakage current (mA) flowing into a short-circuit occurrence point, and defining, as $R_{org\text{-}s}$, organic resistance (Ω) of the short-circuit occurrence point, $I_n$ and $I_s$ may be expressed as follows.

$$I_n = \frac{V_0}{R_{org}} = I_t \times \frac{R_{org} \times R_{org\text{-}s}}{R_{org} + R_{org\text{-}s}} \times \frac{1}{R_{org}} = 0$$

$$I_s = \frac{V_0}{R_{org\text{-}s}} = I_t \times \frac{R_{org} \times R_{org\text{-}s}}{R_{org} + R_{org\text{-}s}} \times \frac{1}{R_{org\text{-}s}} = I_t \times \frac{R_{org}}{R_{org} + R_{org\text{-}s}} = I_t$$

That is, in a case in which the short-circuit occurs in a partial area of the OLED in which the conductive connector is absent, all the set current escapes through the short-circuit area ($I_s$) while $R_{org\text{-}s}$ drops to a value close to "0". Accordingly, in the case of the OLED in which the conductive connector is absent, if the short-circuit occurs, the current may not flow in the normal organic layer and thus, the OLED may not emit light.

In the case of the OLED in which the conductive connector is provided, when defining $I_{n\text{-}cell}$ as current (mA) flowing through a normal light emitting area in the case of the short-circuit occurrence, voltage of each parallel-connected conductive unit is identical and a sum of currents of all of the parallel-connected conductive units is identical to operating current ($I_t$) of the OLED. It may be verified from the following formula.

$$(R_{cell\text{-}org} + R_{cell\text{-}spl}) \times I_{n\text{-}cell} = (R_{cell\text{-}s} + R_{cell\text{-}spl}) \times I_s$$

$$I_t = I_{n\text{-}cell} \times (n_{cell} - 1) + I_s$$

Also, in the case of the OLED in which the conductive connector is provided, the leakage current flowing into the short-circuit occurrence point may be calculated as follows.

$$I_s = I_t \times \frac{(R_{cell\text{-}org} + R_{cell\text{-}spl})}{(R_{cell\text{-}org} + R_{cell\text{-}spl}) + (n_{cell} - 1) \times (R_{cell\text{-}s} + R_{cell\text{-}spl})}$$

Accordingly, in the OLED according to an exemplary embodiment of the present specification in which the conductive connector is provided, even though the organic layer of any one conductive unit is short-circuited ($R_{cell\text{-}s}=0$), it may be possible to significantly decrease an amount of leakage current when a value of a denominator sufficiently increases, which can be verified from the above formula.

The numerical value of the operating current ($I_t$) to the leakage current ($I_s$) of the OLED in which the conductive connector is provided may be expressed as the following Formula 2.

$$\frac{I_s}{I_t} \qquad \text{[Formula 2]}$$

In the above Formula 2, $I_t$(mA) denotes the operating current of the OLED to which the conductive connector is applied and in which the short-circuit defect is absent, and $I_s$(mA) denotes the leakage current of the OLED to which the conductive connector is applied and in which the short-circuit defect is present in any one conductive unit.

Further, the appropriate numerical value range of the operating current ($I_t$) to the leakage current ($I_s$) of the OLED in which the conductive connector is provided may be calculated through the following formula.

$$\frac{I_s}{I_t} = \frac{(R_{cell\text{-}org} + R_{cell\text{-}spl})}{(R_{cell\text{-}org} + R_{cell\text{-}spl}) + (n_{cell} - 1) \times (R_{cell\text{-}s} + R_{cell\text{-}spl})}$$

According to an exemplary embodiment of the present specification, the conductive connector may have a resistance value at which the operating voltage increase rate (($V_t-V_o$)/$V_o$) and the numerical value of the operating current to the leakage current ($I_s/I_t$) of the OLED simultaneously satisfy 0.03 or less. More specifically, the short-circuit preventing layer may have a resistance value at which the operating voltage increase rate (($V_t-V_o$)/$V_o$) and the numerical value of the operating current to the leakage current ($I_s/I_t$) simultaneously satisfy 0.01 or less.

Specifically, according to an exemplary embodiment of the present specification, in the above Formula 1 and the above Formula 2, the current density in the case of operation of the OLED may be any one value of 1 mA/cm$^2$ to 5 mA/cm$^2$.

According to an exemplary embodiment of the present specification, resistance of the conductive connector may satisfy the following Formula 3:

(Length of conductive connector÷width of conductive connector)×surface resistance of conductive connector≥1,000 Ω     [Formula 3]

The length of the conductive connector can be a length from one end portion of the conductive connector to the other end portion thereof as a length of a direction in which current flows in the conductive connector. Also, the width of the conductive connector indicates a width of a direction vertical to the length of the conductive connector and indicates an average value of the width in a case in which the width of the conductive connector is not constant.

That is, according to an exemplary embodiment of the present specification, the resistance of the conductive connector may be 1,000 Ω or more and 300,000 Ω or less.

In a case in which the resistance of the conductive connector is within the above range, the conductive connector may perform an appropriate short-circuit preventing function for the occurrence of the short-circuit defect. That is, in a case in which the resistance of the conductive connector is 1,000 Ω or more, it is possible to effectively prevent the leakage current from flowing in an area in which the short-circuit defect is present.

According to an exemplary embodiment of the present specification, resistance from each conductive unit to the current carrying portion of the first electrode or the auxiliary electrode may be 1,000 Ω or more and 300,000 Ω or less.

According to an exemplary embodiment of the present specification, the conductive units may be electrically connected in parallel to each other. The conductive units may be provided to be separate from each other. A configuration in which the conductive units are separate from each other may be verified using resistance between the following conductive units.

Specifically, according to an exemplary embodiment of the present specification, resistance from the one conductive unit to another conductive unit adjacent thereto may be at least twofold of resistance of the conductive connector. For example, in a case in which a current carrying path between any one conductive unit and another conductive unit adjacent thereto is constituted merely through the conductive connector and the auxiliary electrode, the conductive unit and the other conductive unit adjacent thereto pass through the auxiliary electrode and the conductive connector twice. Accordingly, even though a resistance value of the auxiliary electrode is ignored, the resistance between the conductive units may have a resistance value corresponding to at least twofold of the conductive connector.

According to an exemplary embodiment of the present specification, resistance between the one conductive unit and another conductive unit may be 2,000 Ω or more and 600,000 Ω or less. Specifically, the resistance value indicates resistance from one conductive unit to another conductive unit adjacent thereto through the short-circuit preventing area. That is, that the resistance between the different conductive units is 2,000 Ω or more and 600,000 Ω or less indicates that each conductive unit electrically contacts with the short-circuit preventing area and thereby is supplied with current.

According to an exemplary embodiment of the present specification, in a case in which the conductive units are directly electrically connected to each other instead of being disposed to be separate from each other, a resistance value of the directly connected area may be higher than a resistance value of the conductive connector. In this case, even though the conductive units are not disposed to be completely separate from each other, it may be possible to maintain a normal short-circuit preventing function even in a case in which a short-circuit occurs.

Resistance from the one conductive unit to another conductive unit adjacent thereto indicates resistance reaching the one conductive unit and the conductive connector contacting therewith and/or the short-circuit preventing layer, the auxiliary electrode, another conductive connector and/or short-circuit prevent layer, and another conductive unit contacting therewith.

According to the above Formula 3, the resistance indicates a lower limit value of resistance at which the conductive connector may perform the short-circuit preventing function in a case in which the conductive unit is supplied with the current through the conductive connector.

According to an exemplary embodiment of the present specification, the auxiliary electrode may be disposed to be spaced apart from the conductive unit. That is, the auxiliary electrode may be disposed to be spaced apart from the region of the conductive unit corresponding to the emitting area.

According to an exemplary embodiment of the present specification, the auxiliary electrode may be disposed to be spaced apart from the conductive unit, and the auxiliary electrode may be provided in a net or mesh structure including two or more branch points, with each branch point including three or more branches surrounding the one or more conductive units.

Resistance between the adjacent branch points may be 35 Ω or less.

In the case where a short-circuit defect is generated in a local region of the OLED adopting a short-circuit preventing function, when the auxiliary electrode is provided in a stripe shape, a light emission intensity of a peripheral portion of the local region, in which the short-circuit defect is generated, may be decreased. This causes a flow of current of about 100 times more than that of a normal operation to the local region in which the short-circuit defect is generated, which results in a voltage (IR) drop phenomenon at a large level in the auxiliary electrode of the region in which the short-circuit defect is generated. That is, the entire OLED may be prevented from not being driven by the short-circuit preventing function. Also, a surrounding area of the local region in which the short-circuit defect is generated may become dark, thereby considerably degrading marketability.

Accordingly, in the OLED according to an exemplary embodiment of the present specification, the auxiliary electrode includes two or more branch points, each having three or more branches, so that when the short-circuit is generated, the current may be distributed to a wide region. That is, the voltage drop (IR drop) generated in the auxiliary electrode of the region in which the short-circuit is generated can be reduced or minimized by the auxiliary electrode, and thus, an entire emission intensity of the OLED may be uniform even when such a short-circuit is generated.

According to an exemplary embodiment of the present specification, in the auxiliary electrode, resistance between the adjacent branch points may be 35 Ω or less. Particularly, in the auxiliary electrode, resistance between the adjacent branch points may be 18 Ω or less.

According to an exemplary embodiment of the present specification, a distance between the adjacent branch points of the auxiliary electrode may be 21 mm or less. Particularly, a distance between the adjacent branch points of the auxiliary electrode may be 0.2 mm or more and 21 mm or less.

According to an exemplary embodiment of the present specification, a distance between the adjacent branch points of the auxiliary electrode may be 10 mm or less, or 0.2 mm or more and 10 mm or less.

Further, according to an exemplary embodiment of the present specification, a distance between the adjacent branch points of the auxiliary electrode may be 10 mm or less, and resistance between the adjacent branch points of the auxiliary electrode may be 18 Ω.

When the resistance and/or the distance between the adjacent branch points of the auxiliary electrode belong to the aforementioned ranges, the current may be easily distributed when the short-circuit is generated, thereby reducing or minimizing the voltage drop (IR drop).

According to an exemplary embodiment of the present specification, in the OLED, luminance non-uniformity of 10% or more may not be generated even with the generation of a short-circuit.

The ranges of the distance and the resistance between the adjacent branch points of the auxiliary electrode of the OLED according to an exemplary embodiment of the present specification will be described below.

FIG. 10 illustrates a driving characteristic of the OLED according to an exemplary embodiment of the present specification. That is, FIG. 10 shows luminance according to operating voltage of the OLED.

When an operating voltage of the OLED is 6 V, luminance may be about 3000 nit, and a change in luminance of 10% may be around 2700 nit. Further, a difference in the operating voltage between 3000 nit and 2700 nit is 0.066 V. Further, a difference in the operating voltage at the change in luminance of 5% is 0.033 V.

According to an exemplary embodiment of the present specification, when the OLED has a short-circuit, a voltage drop of 0.066 V or less is desired in order to achieve luminance non-uniformity within 10% of a normal operation. In order to generate the voltage drop of only 0.066 V or less, resistance between the adjacent branch points of the auxiliary electrode connected to the conductive unit in which the short-circuit is generated is desired to be 35 Ω or less. Alternatively, the voltage drop may be reduced by increasing the width of the auxiliary electrode, or by distributing the current with another branch point before the length between the branch points exceeds 21 mm.

Further, according to an exemplary embodiment of the present specification, when the OLED is short-circuited, a voltage drop of 0.033 V or less is desired in order to achieve luminance non-uniformity within 5% of the normal operation. In order to generate the voltage drop of only 0.033 V or less, resistance between the adjacent branch points of the auxiliary electrode connected to the conductive unit in which the short-circuit is generated is desired to be 18 Ω or less. Alternatively, the voltage drop may be reduced by increasing the width of the auxiliary electrode, or by distributing the current with another branch point before the length between the branch points exceeds 10 mm.

According to an exemplary embodiment of the present specification, the first electrode may include at least 1,000 conductive units separate from each other. Specifically, the first electrode may include 1,000 or more and 1,000,000 or less conductive units that are separate from each other.

Also, according to an exemplary embodiment of the present specification, the first electrode may be formed in a pattern of at least two conductive units. Specifically, the conductive unit may be formed in a pattern in which areas excluding the conductive connector are separate from each other.

The pattern of the conductive unit may have a shape of a closed figure. Specifically, the pattern may be provided in a polygonal shape, such as a triangular shape, a rectangular shape, and a hexagonal shape, and may be provided in an amorphous shape.

When the number of conductive units is 1,000 or more, it may possible to reduce or minimize a leakage current amount in the case of the short-circuit occurrence while reducing or minimizing a voltage increase level in the case of the normal operation of the OLED. Also, as the number of conductive units increases up to 1,000,000, the above effects may be maintained while maintaining an aperture ratio. That is, when the number of conductive units exceeds 1,000,000, the aperture ratio may be degraded due to an increase in the number of auxiliary electrodes.

According to an exemplary embodiment of the present specification, an occupying area of the conductive units in the OLED may be 50% or more and 90% or less based on a top view of the entire OLED. Specifically, the conductive unit is included in the light emitting area and the occupying area of the conductive units based on a surface on which an entire OLED emits light may be the same as or similar to an aperture ratio of the OLED.

In the case of the first electrode, the respective conductive units are electrically connected by the conductive connector and thus, driving voltage of the OLED increases. Therefore, according to an exemplary embodiment of the present specification, the first electrode includes 1,000 or more conductive units to supplement an increase in the driving voltage by the conductive connector. As a result, it may be possible to decrease the driving voltage of the OLED and at the same time, to enable the first electrode to have a short-circuit preventing function by the conductive connector.

According to an exemplary embodiment of the present specification, an area of each conductive unit may be 0.01 $mm^2$ or more and 25 $mm^2$ or less.

In the case of reducing the area of each conductive unit, it may be possible to simultaneously decrease an operating voltage increase rate according to the conductive connector introduced for short-circuit prevention and a value of operating current to leakage current. Also, in a case in which a non-emitting conductive unit is present due to the occurrence of short circuit, it may be possible to minimize a decrease in the product quality by minimizing the non-emitting area. Here, in the case of significantly reducing the area of the conductive unit, a ratio of the emitting area in the OLED may significantly decrease and thus, the efficiency of the OLED may be degraded due to a decrease in the aperture ratio. Accordingly, in the case of manufacturing the OLED using the area of the conductive unit, it may be possible to reduce or minimize the aforementioned disadvantages, while maintaining the aforementioned advantages.

According to the OLED of the present specification, the conductive connector, the conductive unit, and the organic layer including the light emitting layer may be electrically connected in series to each other. The light emitting layer may be positioned between the first electrode and the second electrode. Each of at least two light emitting layers may be electrically connected in parallel.

According to an exemplary embodiment of the present specification, the light emitting layer may be positioned between the conductive unit and the second electrode, and the respective light emitting layers may be electrically connected in parallel to each other. That is, the light emitting layer may be positioned to correspond to an area corresponding to the conductive unit.

In a case in which the light emitting layer operates in the same current density, a resistance value increases according to a decrease in an area of the light emitting layer. According to an exemplary embodiment of the present specification, in a case in which an area of each conductive unit decreases and the number of conductive units increases, an area of each light emitting layer also decreases. In this case, in a case in which the OLED operates, a ratio of voltage of the conductive connectors connected in series to the organic layer decreases compared to voltage applied to the organic layer including the light emitting layer.

In a case in which a short-circuit occurs in the OLED according to an exemplary embodiment of the present specification, a leakage current amount may be determined based on a resistance value from the auxiliary electrode to the conductive unit and operating voltage, regardless of the number of conductive units. Accordingly, when increasing the number of conductive units, it may be possible to reduce or minimize a voltage increase phenomenon by the conductive connector in the case of the normal operation, while reducing or minimizing a leakage current amount in the case of the short-circuit occurrence.

According to an exemplary embodiment of the present specification, the surface resistance of the auxiliary electrode may be 3 Ω/☐ or less. Specifically, the surface resistance may be 1 Ω/☐ or less.

In a case in which any one surface resistance of the first electrode and the second electrode having a wide area is higher than a desired level, voltage may vary for each position of the electrode. Accordingly, when a potential difference between the first electrode and the second electrode disposed based on the organic layer varies, the luminance uniformity of the OLED may be degraded. Accordingly, in order to decrease the surface resistance of the first electrode or the second electrode that is higher than the desired level, the auxiliary electrode may be used. The surface resistance of the auxiliary electrode may be 3 Ω/□ or less, and specifically, may be 1 Ω/□ or less. In the above range, the luminance uniformity of the OLED may be maintained at a high level.

According to an exemplary embodiment of the present specification, the first electrode may be formed as a transparent electrode. In this case, the surface resistance of the first electrode may be higher than a surface resistance value suitable for driving the OLED. Accordingly, to decrease the surface resistance value of the first electrode, the surface resistance of the first electrode may be reduced to a surface resistance level of the auxiliary electrode by electrically connecting the auxiliary electrode and the first electrode.

According to an exemplary embodiment of the present specification, the auxiliary electrode may be provided on an area excluding a light emitting area. Specifically, the auxiliary electrode may be provided on the current carrying portion of the first electrode. Alternatively, in a case in which the current carrying portion of the first electrode is absent, the auxiliary electrode may be provided on an area in which the current carrying portion of the first electrode is to be positioned.

According to an exemplary embodiment of the present specification, the auxiliary electrode may include conductive lines that are electrically connected to each other. Specifically, the conductive lines may be configured in a conductive pattern. Specifically, it may be possible to drive an entire auxiliary electrode by applying a voltage to at least a portion of the auxiliary electrode.

According to an exemplary embodiment of the present specification, the OLED may be included in an OLED lighting and thereby used. In the case of the OLED light, it may be desirable to emit light having a uniform brightness from an entire light emitting area, that is, all of the OLEDs. Specifically, to achieve a uniform brightness in the OLED lighting, a voltage between the first electrode and the second electrode of each of all the OLEDs included in the OLED lighting may be maintained to be constant.

In a case in which the first electrode is a transparent electrode and the second electrode is a metal electrode, a surface resistance of the second electrode of each OLED is sufficiently low and thus, a voltage difference of the second electrode of each OLED barely exists. However, in the case of the first electrode, a voltage difference of each OLED may be present. According to an exemplary embodiment of the present specification, the auxiliary electrode, specifically, a metal auxiliary electrode may be used to compensate for such a voltage difference of the first electrode of each OLED.

According to an exemplary embodiment of the present specification, the metal auxiliary electrode may include conductive lines that are electrically connected to each other. Specifically, the auxiliary electrode forms the conductive line, thereby enabling the voltage difference of the first electrode of each OLED to barely exist.

According to an exemplary embodiment of the present specification, the surface resistance of the conductive unit may be 1 Ω/□ or more, or may be 3 Ω/□ or more, and particularly, may be 10 Ω/□ or more. Also, the surface resistance of the conductive unit may be 10,000 Ω/□ or less, or may be 1,000 Ω/□ or less. That is, the surface resistance of the conductive unit may be 1 Ω/□ or more and 10,000 Ω/□ or less, or may be 10 Ω/□ or more and 1,000 Ω/□ or less.

According to an exemplary embodiment of the present specification, a surface resistance level suitable for the conductive unit may be controlled to be in an inverse proportion to an area of the conductive unit corresponding to a light emitting area. For example, when the conductive unit has a light emitting area corresponding to an area of 100 cm$^2$, the surface resistance suitable for the conductive unit may be around 1 Ω/□. Further, in the case of forming an area of each conductive unit to be small, the surface resistance suitable for the conductive unit may be 1 Ω/□ or more.

According to an exemplary embodiment of the present specification, in a case in which the first electrode is formed as a transparent electrode such as ITO, the auxiliary electrode may be employed to satisfy the surface resistance of the conductive unit as 1 Ω/□ or more. Specifically, the auxiliary electrode may be a metal auxiliary electrode.

The surface resistance of the conductive unit may be determined based on a material for forming the conductive unit, and may also be decreased to a surface resistance level of the auxiliary electrode through being electrically connected to the auxiliary electrode. Accordingly, a surface resistance value of the conductive unit suitable for the OLED may be adjusted based on a material of the auxiliary electrode and the conductive unit.

According to an exemplary embodiment of the present specification, the OLED may further include a short-circuit preventing layer provided between the first electrode and the auxiliary electrode. The short-circuit preventing layer may assist the short-circuit preventing function of the conductive connector.

According to an exemplary embodiment of the present specification, the short-circuit preventing layer may be provided on at least one surface of the auxiliary electrode in contact therewith. Specifically, according to an exemplary embodiment of the present specification, the short-circuit preventing layer may be provided on a top surface, a bottom surface, or a side surface on which the auxiliary electrode is formed.

According to an exemplary embodiment of the present specification, the OLED may further include a short-circuit preventing layer provided between the first electrode and the auxiliary electrode, and the auxiliary electrode may electrically connect the conductive units through the short-circuit preventing layer.

The short-circuit preventing layer may be provided on the current carrying portion of the first electrode. Alternatively, when the current carrying portion of the first electrode is absent, the short-circuit preventing layer may be provided at one end portion of the conductive connector in contact therewith.

According to an exemplary embodiment of the present specification, in a case in which the OLED includes the short-circuit preventing layer, the conductive connector of Formula 1 and Formula 2 may be interpreted to mean that the conductive connector and the short-circuit preventing layer are included.

According to an exemplary embodiment of the present specification, resistance from the auxiliary electrode of the short-circuit preventing layer to the first electrode may be 1,000 Ω or more and 300,000 Ω or less. Specifically, the resistance from the auxiliary electrode of the short-circuit preventing layer to the first electrode may be resistance from the auxiliary electrode to any one conductive connector.

Specifically, according to an exemplary embodiment of the present specification, the OLED may further include a short-circuit preventing layer provided between the first electrode and the auxiliary electrode, and resistance from the auxiliary electrode to the first electrode may be 1,000 Ω or more and 300,000 Ω or less.

Also, according to an exemplary embodiment of the present specification, due to an increase in resistance resulting from the short-circuit preventing layer, the resistance between the auxiliary electrode and the conductive unit electrically connected through the short-circuit preventing layer may be 1,000 Ω or more and 300,000 Ω or less.

According to an exemplary embodiment of the present specification, the thickness of the short-circuit preventing layer may be 1 nm or more and 10 μm or less.

The short-circuit preventing layer within the thickness range and/or the thickness direction resistance range may maintain normal operating voltage in a case in which a short-circuit does not occur in the OLED. Also, even when a short-circuit occurs in the OLED within the thickness range and/or the thickness direction resistance range, the OLED may operate within the normal range.

Specifically, according to an exemplary embodiment of the present specification, resistance of the short-circuit preventing layer indicates resistance from the auxiliary electrode to the conductive connector. Alternatively, according to an exemplary embodiment of the present specification, the resistance of the short-circuit preventing layer indicates resistance from the auxiliary electrode to the current carrying portion of the first electrode. That is, the resistance of the short-circuit preventing layer indicates resistance according to an electrical distance for electrical connection from the auxiliary electrode to the conductive connector.

According to an exemplary embodiment of the present specification, the volume resistivity $(\rho_{slp})$(Ωcm) of the short-circuit preventing layer may be calculated according to the following formula.

$$\rho_{spl} = \frac{R_{cell\text{-}spl} \times A_{spl}}{t_{spl}}$$

$A_{spl}(cm^2)$ denotes an area in which electricity may flow in a thickness direction from the auxiliary electrode formed at one conductive unit to one conductive unit through the short-circuit preventing layer. That is, $A_{spl}(cm^2)$ may mean an area overlapping an area of the auxiliary electrode formed at an upper portion of the short-circuit preventing layer in the area of the short-circuit preventing area formed on one first electrode.

$R_{cell\text{-}spl}$ denotes resistance (Ω) of the short-circuit preventing portion in one conductive unit.

$t_{slp}$(μm) may denote a thickness of the short-circuit preventing layer or the shortest distance in which electricity moves from the auxiliary electrode to the conductive connector or the conductive unit.

The thickness direction follows an example in which the electricity moves in the short-circuit preventing layer and indicates a direction in which the electricity moves from one area of the short-circuit preventing layer to another area thereof.

Particularly, $A_{spl}(cm^2)$ may denote an area of the short-circuit preventing layer simultaneously overlapping the first electrode at a lower side and the auxiliary electrode at an upper side when the short-circuit preventing layer is positioned between the first electrode and the auxiliary electrode. For example, when the entire lower surface of the short-circuit preventing layer is formed to be in contact with the upper surface of the first electrode, and the auxiliary electrode is formed to be in contact with the entire upper surface of the short-circuit preventing layer, $A_{spl}(cm^2)$ may denote an area of the short-circuit preventing layer overlapping the first electrode. For another example, when the entire lower surface of the short-circuit preventing layer is formed to be in contact with the upper surface of the first electrode, and the auxiliary electrode is formed on a partial upper surface of the short-circuit preventing layer, $A_{spl}(cm^2)$ may denote an area of the short-circuit preventing layer simultaneously overlapping the first electrode and the auxiliary electrode.

As can be seen from the above formula, the volume resistivity $(\rho_{slp})$ of the short-circuit preventing layer formed at one conductive unit may be determined based on the resistance $(R_{cell\text{-}spl})$ in the thickness direction of the short-circuit preventing layer in one conductive unit, the area $(A_{spl})$ in which the electricity may flow in the thickness direction from the auxiliary electrode formed at one conductive unit to one conductive unit through the short-circuit preventing layer, and the thickness $(t_{slp})$ of the short-circuit preventing layer.

According to an exemplary embodiment of the present specification, the volume resistivity of the short-circuit preventing layer may be 9 Ω cm or more and $8.1 \times 10^{10}$ Ω cm or less. Within the above range, the short-circuit preventing layer may maintain normal operating voltage in a case in which the short-circuit does not occur in the OLED. Also, the short-circuit preventing layer may perform a short-circuit preventing function. Even through the short-circuit occurs, the OLED may operate within the normal range. The volume resistivity may be calculated as follows.

According to an exemplary embodiment of the present specification, in a case in which a resistance range of the short-circuit preventing layer is 1,000 Ω or more and 300,000 Ω or less, the thickness of the short-circuit preventing layer is 1 nm or more and 10 μm or less, and an area of one cell is 300×300 μm² to 3×3 mm², the area $(A_{spl})$ in which the electricity may flow in the thickness direction from the auxiliary electrode formed on the one cell to the first electrode of one cell through the short-circuit preventing layer may be determined within the range of 1% to 30% of the area of one cell. Accordingly, the area $(A_{spl})$ in which the electricity may flow in the thickness direction from the auxiliary electrode formed at the one cell to the first electrode of one cell through the short-circuit preventing layer may be $9 \times 10^{-6}$ cm² (300 μm×300 μm×0.01) to $2.7 \times 10^{-2}$ cm² (0.3 cm×0.3 cm×0.3). In this case, the volume resistivity of the short-circuit preventing layer may be calculated according to the following formula.

$$\frac{1{,}000 \, \Omega \times 9 \times 10^{-6} \text{ cm}^2}{10 \, \mu m} \leq \rho_{spl} \leq \frac{300{,}000 \, \Omega \times 2.7 \times 10^{-2} \text{ cm}^2}{0.001 \, \mu m}$$

According to an exemplary embodiment of the present specification, the short-circuit preventing layer may include one or more selected from a group including carbon powder; carbon film; conductive polymer; organic polymer; metal; metal oxide; inorganic oxide; metal sulfide; and insulating material. Specifically, a mixture of at least two selected from zirconium oxide ($ZrO_2$), nichrome, indium tin oxide (ITO), zinc sulfide (ZnS), and silicon dioxide ($SiO_2$) may be used for the short-circuit preventing layer.

According to an exemplary embodiment of the present specification, the OLED may further include a substrate and the first electrode may be provided on the substrate.

According to an exemplary embodiment of the present specification, the first electrode may be a transparent electrode.

When the first electrode is the transparent electrode, the first electrode may be manufactured using conductive oxide such as indium tin oxide (ITO) or indium zinc oxide (IZO). Further, the first electrode may also be a translucent electrode. When the first electrode is the translucent electrode, the first electrode may be manufactured using a translucent metal such as Ag, Au, Mg, Ca, or the alloy thereof. When the translucent metal is used for the first electrode, the OLED may have a micro-cavity structure.

According to an exemplary embodiment of the present specification, the auxiliary electrode may be formed of a metal material. That is, the auxiliary electrode may be a metal electrode.

The auxiliary electrode may be formed of any type of metals. Specifically, the metals may include aluminum, copper, and/or silver having an excellent conductivity. In the case of using aluminum for stability during an adhesive power and photolithography process with a transparent electrode, the auxiliary electrode may also use a layer of molybdenum/aluminum/molybdenum.

According to an exemplary embodiment of the present specification, the organic layer may include at least one light emitting layer and may further include one or more selected from a group including a hole injecting layer; a hole transporting layer; a hole preventing layer; a charge generating layer; an electron preventing layer; an electron transporting layer; and an electron injecting layer.

The charge generating layer refers to a layer in which holes and electrons are generated when a voltage is applied thereto.

The substrate may use a substrate having a good transparency, surface smoothness, easy, handling and waterproof. Specifically, the substrate may use a glass substrate, a thin film glass substrate or a transparent plastic substrate. A film, such as polyethylene terephthalate (PET), polyethylene naphthalate (PEN), polyether ether ketone (PEEK), and polyimide (PI), may be included in the plastic substrate in a form of a single layer or a plurality of layers. Also, the substrate may autonomously include a light scattering function. Here, the substrate is not limited thereto and may use a substrate generally used for the OLED.

According to an exemplary embodiment of the present specification, the first electrode may be an anode and the second electrode may be a cathode. Also, the first electrode may be the cathode and the second electrode may be the anode.

A material having a high work function may be used for the anode so that hole injection into the organic layer may be smoothly performed. Specific examples of an anode material may include a metal such as vanadium, chrome, copper, zinc, and gold, or the alloy thereof; metal oxide such as zinc oxide, indium oxide, indium tin oxide (ITO), and indium zinc oxide (IZO); a combination of a metal and oxide such as ZnO:Al or $SnO_2$:Sb; conductive polymer such as poly (3-methylthophene), poly[3,4-(ethylene-1,2-dioxy) thiophene] (PEDOT), polypyrrole, and polyaniline, and the like, but are not limited thereto.

The anode material is not limited only to the anode and may be used as a material of the cathode.

A material having a low work function may be used for the cathode so that electron injection into the organic layer may be smoothly performed. Specific example of a cathode material may include a metal such as magnesium, calcium, sodium, potassium, titanium, indium, yttrium, lithium, gadolinium, aluminum, silver, tin, and lead, or the alloy thereof; a multi-structured material such as LiF/Al or $LiO_2$/Al, and the like, but are not limited thereto.

The cathode material is not limited only to the cathode and may be used as a material of the anode.

A material having a high mobility with respect to holes may be suitable for a material of the hole transporting layer according to an exemplary embodiment of the present specification, which is a material capable of receiving a hole from the anode or the hole injecting layer and transporting the hole to the light emitting layer. Specific examples thereof may include an arylamine-based organic material, conductive polymer, and block copolymer in which a conjugate portion and a non-conjugate portion are present together, but are limited thereto.

A material having a high quantum efficiency with respect to fluorescence or phosphorescence may be suitable for a material of the light emitting layer according to an exemplary embodiment of the present specification, which is a material capable of emitting light of a visible area by receiving holes and electrons from the hole transporting layer and the electron transporting layer, respectively, and thereby combining the holes and the electrons. Specific examples thereof may include 8-hydroxy-quinoline aluminum complex ($Alq_3$); carbazole-based compound; dimerized styryl compound; BAlq; 10-hydroxy benzoquinoline-metal compound; benzoxazole, benzthiazole and bezimidazole-based compound; poly (p-phenylenevinylene) (PPV) based polymer; spiro compound; polyfluorrene; rubrenes, and the like, but are not limited thereto.

A material having a high mobility with respect to electrons may be suitable for a material of the electron transporting layer according to an exemplary embodiment of the present specification, which is a material capable of receiving electrons injected from the cathode and transporting the electrons to the light emitting layer. Specific examples thereof may include Al complex of 8-hydroxyquinoline; complex including $Alq_3$; organic radical compound; hydroxyflavone-metal complex, and the like, but are not limited thereto.

According to an exemplary embodiment of the present specification, the auxiliary electrode may be positioned on a non-emitting area of the OLED.

According to an exemplary embodiment of the present specification, the OLED may further include an insulating layer provided on the non-emitting area.

According to an exemplary embodiment of the present specification, the additional insulating layer may insulate the auxiliary electrode from the organic layer.

According to an exemplary embodiment of the present specification, the OLED may be sealed with an encapsulating layer.

The encapsulating layer may be formed as a transparent resin layer. The encapsulating layer may function to protect the OLED from oxygen and pollutant materials and may be formed of a transparent material in order not to degrade the luminescence of the OLED. The transparency indicates transmitting 60% or more of light. Specifically, the transparency indicates transmitting 75% or more of light.

According to an exemplary embodiment of the present specification, the OLED may emit a white light having a color temperature of 2,000 K or more and 12,000 K or less.

According to an exemplary embodiment of the present specification, the OLED may further include a light scattering layer.

Specifically, according to an exemplary embodiment of the present specification, the OLED may further include a substrate provided on a surface facing a surface on which the organic layer of the first electrode is provided, and may further include the light scattering layer provided between the substrate and the first electrode. According to an exemplary embodiment of the present specification, the light scattering layer may include a flattening layer. According to an exemplary embodiment of the present specification, the flattening layer may be provided between the first electrode and the light scattering layer.

Alternatively, according to an exemplary embodiment of the present specification, the OLED may further include a light scattering layer provided on a surface facing a surface on which the first electrode of the substrate is provided.

According to an exemplary embodiment of the present specification, if the light scattering layer is provided in a structure capable of improving a light scattering efficiency of the OLED by inducing light scattering, the light scattering layer is not particularly limited. Specifically, according to an exemplary embodiment of the present specification, the light scattering layer may be provided in a structure in which scattering particles are distributed within a binder, a film having an unevenness, and/or a film having haziness.

According to an exemplary embodiment of the present specification, the light scattering layer may be directly formed on the substrate using a method such as spin coating, bar coating, and slit coating, or may be formed using a method of manufacturing the light scattering layer in a film form and thereby attaching the same.

According to an exemplary embodiment of the present specification, the OLED may be a flexible OLED. In this case, the substrate may include a flexible material. Specifically, the substrate may be a bendable thin-film glass substrate, a plastic substrate, or a film type substrate.

A material of the plastic substrate is not particularly limited, but may generally include a film, such as polyethylene terephthalate (PET), polyethylene naphthalate (PEN), polyether ether ketone (PEEK), and polyimide (PI), in a form of a single layer or a plurality of layers.

An exemplary embodiment of the present specification provides a display device including an OLED. In the display device, the OLED may function as a pixel or a backlight. In addition, various configurations known in the art can be applied to the display device.

An exemplary embodiment of the present specification provides a lighting device including an OLED. In the lighting device, the OLED may function as a light emitter. In addition, various configurations known in the art may be applied to the lighting device.

An exemplary embodiment of the present specification provides a method for manufacturing the OLED, including: preparing a substrate; forming a first electrode including two or more conductive units, and conductive connectors connected to the conductive units, respectively, on the substrate; forming an auxiliary electrode on the substrate; forming an insulating layer between at least a part of the conductive connector and the auxiliary electrode; forming at least one organic layer on the first electrode; and forming a second electrode on the organic layer.

According to an exemplary embodiment of the present specification, the forming of the first electrode may apply and then pattern a first electrode material on the substrate. By patterning the first electrode, the first electrode may include the at least two conductive units, the conductive connector, and/or the current carrying portion of the first electrode.

FIGS. 7 and 8 illustrate a method of manufacturing an OLED according to exemplary embodiments of the present specification. FIGS. 7A and 8A illustrate that a first electrode 8 is formed on a substrate 6, FIGS. 7B and 8B illustrate that a conductive unit 1 and a conductive connector 2 are formed by patterning the first electrode, FIGS. 7C and 8C illustrate that an insulating layer is formed, FIGS. 7D and 8D illustrate that an auxiliary electrode is formed, and FIGS. 7E and 8E illustrate that an additional insulating layer is formed on a non-emitting area.

According to an exemplary embodiment of the present specification, the manufacturing method may include forming the auxiliary electrode after the forming of the first electrode.

According to an exemplary embodiment of the present specification, the insulating layer may be formed on at least a part of the conductive connector and the auxiliary electrode may be formed on the insulating layer, after the forming of the first electrode on the substrate.

Further, according to an exemplary embodiment of the present specification, the manufacturing method may include forming the first electrode after the forming of the auxiliary electrode.

According to an exemplary embodiment of the present specification, the insulating layer may be formed, and the first electrode may be formed so that at least a part of the conductive connector is provided on the insulating layer, after the forming of the auxiliary electrode on the substrate.

Otherwise, according to an exemplary embodiment of the present specification, the manufacturing method may include forming the first electrode after the forming of the auxiliary electrode. In this case, the forming of the insulating layer may be included between the forming of the auxiliary electrode and the forming of the first electrode.

Further, according to an exemplary embodiment of the present specification, the manufacturing method of the OLED may further include forming a short-circuit preventing layer between the forming of the first electrode and the forming of the auxiliary electrode.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

DESCRIPTION OF REFERENCE NUMERALS

1: Conductive unit
2: Conductive connector
3: Auxiliary electrode
4: Current carrying portion of first electrode
5: Insulating layer
6: Substrate
7: Additional insulating layer
8: First electrode

The invention claimed is:
1. An organic light emitting device (OLED), comprising:
a first electrode including at least two conductive units, each of the at least two conductive units connected to a conductive connector that is a part of a pattern of the first electrode;
a second electrode facing the first electrode;
an organic layer between the first electrode and the second electrode;
an auxiliary electrode electrically connected to the conductive connector; and an insulating layer between the conductive connector and the auxiliary electrode,
wherein the conductive connector overlaps the auxiliary electrode, with the insulating layer therebetween.

2. The OLED of claim 1, wherein the conductive connector includes a short-circuit preventing area in which a length of a direction, in which a current substantially flows, is longer than a width of a direction vertical to the length of the direction, and wherein the insulating layer is provided on the short-circuit preventing area.

3. The OLED of claim 1, wherein at least a portion of the conductive connector contacts the auxiliary electrode in a non-emitting area of the OLED.

4. The OLED of claim 1, wherein the auxiliary electrode and the conductive connector overlap with each other in a non-emitting area of the OLED.

5. The OLED of claim 1, wherein the conductive units are electrically connected to the auxiliary electrode in parallel.

6. The OLED of claim 1, wherein each of the at least two conductive units is electrically connected to a one distal end of any one of the conductive connector, and the auxiliary electrode is electrically connected to another distal end of any one of the conductive connector.

7. The OLED of claim 1, wherein the first electrode further includes a current carrying portion of the first electrode electrically connecting the conductive connector connected to each of the at least two conductive units, and the auxiliary electrode is electrically connected to the conductive connector through the current carrying portion of the first electrode.

8. The OLED of claim 1, wherein the auxiliary electrode is spaced apart from the at least two conductive units.

9. The OLED of claim 1, wherein at a current density of any one value of 1 mA/cm² to 5 mA/cm², the conductive connector has a resistance value at which an operating voltage increase rate of the following Formula 1 and a numerical value of operating current to leakage current of the following Formula 2 simultaneously satisfy 0.03 or less:

$$\frac{V_t - V_o}{V_o} \quad \text{[Formula 1]}$$

$$\frac{I_s}{I_t} \quad \text{[Formula 2]}$$

($V_t$(V) denotes an operating voltage of the OLED to which the conductive connector is applied and in which a short-circuit defect is absent,
$V_o$(V) denotes an operating voltage of the OLED to which the conductive connector is not applied and in which the short-circuit defect is absent,
$I_t$(mA) denotes an operating current of the OLED to which the conductive connector is applied and in which the short-circuit defect is absent, and
$I_s$(mA) denotes a leakage current of the OLED to which the conductive connector is applied and in which the short-circuit defect is present in any one conductive unit).

10. The OLED of claim 1, wherein a resistance of the conductive connector is 1,000 Ω or more and 300,000 Ω or less.

11. The OLED of claim 1, wherein a resistance between the at least two conductive units adjacent thereto is at least twofold of a resistance of the conductive connector.

12. The OLED of claim 1, wherein the auxiliary electrode is spaced apart from the at least two conductive units, and the auxiliary electrode is provided in a net structure including two or more branch points, each branch point including three or more branches, with the auxiliary electrode surrounding the at least two conductive units.

13. The OLED of claim 12, wherein a resistance between two immediately adjacent branch points of the two or more branch points is 35 Ω or less.

14. The OLED of claim 1, wherein the first electrode includes 1,000 or more conductive units that are spaced apart from each other.

15. The OLED of claim 1, wherein an area of each of the at least two conductive units is 0.01 mm² or more and 25 mm² or less.

16. The OLED of claim 1, wherein a surface resistance of each of the at least two conductive units is 1 Ω/☐ or more.

17. The OLED of claim 1, wherein a surface resistance of the auxiliary electrode is 3 Ω/☐ or less.

18. The OLED of claim 1, further comprising: a short-circuit preventing layer between the first electrode and the auxiliary electrode, wherein the auxiliary electrode is electrically connected to the at least two conductive units through the short-circuit preventing layer.

19. The OLED of claim 18, a thickness of the short-circuit preventing layer is 1 nm or more and 10 µm or less.

20. The OLED according to claim 18, wherein the short-circuit preventing layer includes one or more selected from a group consisting of a carbon powder; a carbon film; a conductive polymer; an organic polymer; metal; a metal oxide; an inorganic oxide; a metal sulfide; and an insulating material.

21. The OLED according to claim 1, wherein the OLED emits a white light having a color temperature of 2,000 K or more and 12,000 K or less.

22. The OLED according to claim 1, further comprising: a substrate provided on a surface facing a surface on which an organic layer of the first electrode is provided; and a light scattering layer provided between the substrate and the first electrode.

23. The OLED according to claim 22, wherein the light scattering layer includes a flattening layer.

24. The OLED according to claim 1, further comprising:
a substrate provided on a surface facing a surface on which an organic layer of the first electrode is provided; and
a light scattering layer provided on a surface facing a surface on which the first electrode of the substrate is provided.

25. The OLED according to claim 1, wherein the OLED is a flexible OLED.

26. The OLED according to claim 1, wherein the OLED is a display device or a lighting device.

27. A method for manufacturing an organic light emitting device (OLED), the method comprising:
preparing a substrate;
forming a first electrode including two or more conductive units, each of the two or more conductive units connected to a conductive connector of the first electrode on a substrate;
forming an auxiliary electrode on the substrate;
forming an insulating layer between the conductive connector and the auxiliary electrode, wherein the conductive connector overlaps the auxiliary electrode, with the insulating layer therebetween;
forming an organic layer on the first electrode; and
forming a second electrode on the organic layer.

28. The method according to claim 27, wherein the forming of the first electrode includes depositing and patterning a first electrode material on the substrate.

29. The method according to claim 27, further comprising:
forming a short-circuit preventing layer between the first electrode and the auxiliary electrode during a period between the forming of the first electrode and the forming of the auxiliary electrode.

* * * * *